US012754251B2

(12) United States Patent
Laurent et al.

(10) Patent No.: US 12,754,251 B2
(45) Date of Patent: Oct. 6, 2026

(54) METHOD FOR PREDICTING BY ARTIFICIAL INTELLIGENCE THE REMAINING LIFE OF AN ELECTROCHEMICAL BATTERY CELL AND ASSOCIATED DEVICES

(71) Applicant: SAFT, Levallois Perret (FR)

(72) Inventors: Sébastien Laurent, Merignac (FR); Mouna Dahmani, Bordeaux (FR); Sébastien Benjamin, Leognan (FR)

(73) Assignee: SAFT, Levallois Perret (FR)

( * ) Notice: Subject to any disclaimer, the term of this patent is extended or adjusted under 35 U.S.C. 154(b) by 434 days.

(21) Appl. No.: 18/288,089

(22) PCT Filed: Apr. 29, 2021

(86) PCT No.: PCT/FR2021/000043
§ 371 (c)(1),
(2) Date: Oct. 24, 2023

(87) PCT Pub. No.: WO2022/229516
PCT Pub. Date: Nov. 3, 2022

(65) Prior Publication Data
US 2024/0210486 A1 Jun. 27, 2024

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/374* (2019.01); (Continued)

(58) Field of Classification Search
None
See application file for complete search history.

(56) References Cited

U.S. PATENT DOCUMENTS 7,554,296 B2 * 6/2009 Mizuno .............. G01R 31/3648 324/426
2015/0070024 A1 * 3/2015 Kim ..................... G01R 31/392 324/430
(Continued)

FOREIGN PATENT DOCUMENTS

EP 3 364 203 A1 8/2018

OTHER PUBLICATIONS

Rapport De Recherche Internationale issued in International Application No. PCT/FR2021/000043 dated Jan. 27, 2022.
(Continued)

*Primary Examiner* — Lina Cordero
(74) *Attorney, Agent, or Firm* — Troutman Pepper Locke LLP

(57) ABSTRACT

The invention relates to a method for predicting the remaining life of an electrochemical cell having a SOC-OCV characteristic with a planar portion extending between two limits, said method comprising the steps of obtaining voltage and current measurements from the electrochemical cell during a discharge, detecting a limit; calculating the values at the voltage limit detected and the amount of charge lost; predicting the resistance and capacitance of the electrochemical cell by applying respective predictive functions obtained by a learning technique to the voltage and the amount of charge lost at the limit detected; and predicting the remaining life of the electrochemical cell from the predicted resistance and predicted capacitance.

11 Claims, 3 Drawing Sheets

(51) Int. Cl.
*G01R 31/374* (2019.01)
*G01R 31/3842* (2019.01)
*G01R 31/389* (2019.01)
*G01R 31/396* (2019.01)
*H02J 7/80* (2026.01)

(52) U.S. Cl.
CPC ....... *G01R 31/3842* (2019.01); *G01R 31/389* (2019.01); *G01R 31/396* (2019.01); *H02J 7/80* (2026.01)

(56) References Cited

U.S. PATENT DOCUMENTS

2016/0178706 A1* 6/2016 Liu ...................... G01R 31/392
702/63
2018/0236891 A1* 8/2018 Suzuki .................. B60L 3/0046

OTHER PUBLICATIONS

Xue, Q., et al. “Remaining Useful Life Prediction for Lithium-Ion Batteries Based on Capacity Estimation and Box-Cox Transformation” Transactions on Vehicular Technology 60(12):14765-14779 (2020). cited in ISR submitted herewith.

Yang, N., et al. “Robust State of Health Estimation of Lithium-ion Batteries Using Convolutional Neural Network and Random Forest” arXiv:2010.10452v1 {eess.SP] BNSDOCID: <XP_81791116A_I_> 9 pages (2020). cited in ISR submitted herewith.

* cited by examiner

METHOD FOR PREDICTING BY ARTIFICIAL INTELLIGENCE THE REMAINING LIFE OF AN ELECTROCHEMICAL BATTERY CELL AND ASSOCIATED DEVICES

CROSS REFERENCE TO RELATED APPLICATIONS

The present application is a U.S. National Phase Application under 35 U.S.C. § 371 of International Patent Application No. PCT/FR2021/000043 filed Apr. 29, 2021. The entire contents of which are hereby incorporated by reference.

FIELD OF THE INVENTION

The present invention relates to a method for predicting a parameter relating to the remaining life of at least one electrochemical cell of a battery. The present invention further relates to an associated calculator, an associated management system and an associated battery.

BACKGROUND

Typically, a battery comprises one or a plurality of current accumulators also called electrochemical generators, cells or elements. An accumulator is a device for producing electricity wherein chemical energy is converted into electrical energy. The chemical energy comes from electrochemically active compounds deposited on at least one face of electrodes arranged in the accumulator. Electrical energy is produced by electrochemical reactions during a discharge of the accumulator. The electrodes are arranged in a container and are electrically connected to current output terminals which provide electrical continuity between the electrodes and an electrical consumer with which the accumulator is associated.

In order to increase the electrical power delivered, it is possible to combine a plurality of accumulators, sealed from one another, to form a battery. Thereby, a battery can be divided into modules, each module being composed of one or a plurality of accumulators connected together in series and/or in parallel. Thereby, a battery can e.g. comprise one or a plurality of parallel branches of accumulators connected in series and/or one or a plurality of parallel branches of modules connected in series.

A charging circuit is generally provided to which the battery can be connected in order to recharge the accumulators.

Moreover, an electronic management system comprising measurement sensors and an electronic control circuit, variably advanced depending on the applications, can be associated with the battery. Such a system can be used in particular for organizing and controlling the charging and discharging of the battery, in order to balance the charging and discharging of the different accumulators of the battery with respect to one another.

The state of health status is useful information for the electronic battery management system, in order to optimize the use and life thereof. The state of health is often referred to by the SOH thereof.

The state of health (SOH) is used for estimating the aging of the battery between a new state and an end-of-life state, or more generally, between an initial state and a final state.

A technique for determining the state of health (SOH) is a technique wherein temperature, voltage, and, if appropriate, current values for the battery are monitored, for determining the SOH value from laws of aging. Such laws of aging are obtained from tests carried out in the laboratory. Thereby, the application of the laws of aging to the monitored values gives an estimation of the aging of the battery.

However, such static technique assumes a homogeneous aging of the accumulators of the battery and a power circuit without failure between the accumulators.

Another technique for determining the SOH is a technique wherein the ratio of the battery resistance at a given time is calculated by measuring the voltage and the current on the resistance of the battery in the new or initial state, under the same measurement conditions (in particular under the same temperature conditions). In fact, the resistance increases with the aging of the battery, reflecting a loss of power. In such a case, the expression "State of Health related to battery Resistance" or the abbreviation SOHR thereof, is often used.

It is also known how to characterize a resistance on a current scale.

Such a technique consists in measuring the ratio between the voltage change and the current change. But such a solution requires a specific additional cycle and is thus not natively feasible because the cycle involves the presence of a charger with a significant pulse capacitance, which is constraining for the user.

Furthermore, such a technique is difficult to reproduce in use because the pulse time, the value of the state of charge at the moment when the pulse is produced, as well as the pulse current, are all variables which influence the measurement of the resistance.

Moreover, even if the technique were feasible and reproducible, the change of the chemical properties of the element with aging involves a modification of certain internal parameters such as e.g. time constants. Thus, such a technique does not make it possible to give significant information on an actual aging. As a result, the aging is often minimized when the resistance is estimated on the transient zone of a current step.

It is also known how to obtain the SOH state of health from the ratio between the capacitance of the battery at a given time and the capacitance of the battery in the new or initial state under the same measurement conditions (in particular under the same temperature conditions). In fact, capacitance decreases with aging, reflecting a loss of available energy. In such a case, the expression "State of Health related to battery Capacity" or the abbreviation SOHC thereof, is often used.

In certain electrochemical cells, because the change of the open circuit voltage as a function of the state of charge has a plateau, the possible calculations are limited because it is not possible to associate, in a precise way, a state of charge with a voltage measurement.

For such type of element, the aging in terms of capacitance can be determined over a full discharge during a maintenance cycle.

Another technique for determining aging in terms of capacitance is to observe the shape of the deformation of the cell over a partial cycle.

However, such method cannot be used for determining the aging of a battery in terms of resistance.

There is thus a need for a method of predicting a parameter relating to the remaining life of an electrochemical cell of a battery which makes it possible to obtain a precise determination of the parameter for an electrochemical cell having a plateau in the open circuit voltage-state of charge characteristic.

SUMMARY

For this purpose, the description describes a method for predicting a parameter relating to the remaining life of at least one electrochemical cell of a battery, the at least one electrochemical cell having a resistance, a capacitance and an open circuit voltage-state of charge characteristic with a planar portion, a planar portion being a portion wherein the change of the open circuit voltage is less than 30 mV for a change of at least 10% of the state of charge, the planar portion extending between a first limit corresponding to a first value of state of charge and a second limit corresponding to a second value of state of charge. The method is implemented by a calculator and the method comprises a step of obtaining voltage and current measurements of the at least one electrochemical cell during a discharge comprising one limit of the planar portion and beginning at an initial instant, a step of detecting one limit of the planar portion using a criterion depending on the voltage and on the current, a step of calculating the values at the detected limit of a first parameter and of a second parameter, the first parameter being a parameter relating to the voltage and the second parameter being a parameter relating to the amount of charge lost since the initial instant, a step of predicting the resistance of the at least one electrochemical cell by applying a first prediction function to first input parameters, the first input parameters comprising the value of the first parameter at the detected limit and the value of the second parameter at the detected limit, the first prediction function being obtained by a first learning technique, so as to obtain a predicted value of resistance. The prediction method further comprises a step of predicting the capacitance of the at least one electrochemical cell by applying a second prediction function to second input parameters, the second input parameters comprising the value of the first parameter at the detected limit and the value of the second parameter at the detected limit, the second prediction function being obtained by a second learning technique, so as to obtain a predicted value of capacitance, and a step of predicting a parameter relating to the remaining life of the at least one electrochemical cell from the value of predicted resistance and the value of predicted capacitance.

According to particular embodiments, the prediction method has one or a plurality of the following features, taken individually or according to all technically possible combinations:

- the step of predicting a parameter relating to the life is implemented by applying a third prediction function to third input parameters, the third input parameters comprising the value of the predicted resistance, the value of the predicted capacitance, the value of the first parameter at the detected limit and the value of the second parameter at the detected limit, the third prediction function being obtained by a third learning technique.
- the third technique uses a vector autoregressive algorithm.
- during the obtaining step, temperature measurements of the at least one electrochemical cell are also obtained during discharge and, during the calculation step, the value of the current at the detected limit and the value of the temperature at the detected limit also being calculated, the first input parameters and the second input parameters consisting of the value of the detected limit current, the value of the detected limit temperature, the value of the first parameter and the value of the second parameter.
- during the calculation step, the value of the detected limit current and the value of the detected limit temperature are also calculated, the first input parameters consisting of the detected limit current value, the detected limit temperature value, the value of the first parameter and the value of the second parameter and the second input parameters consisting of the value of the detected limit current, the value of the detected limit temperature, the value of the first parameter, the value of the second parameter and the estimated resistance.
- The first technique uses an algorithm chosen amongst a random forest algorithm, a K-nearest neighbors algorithm, a support vector regression algorithm and a polynomial regression algorithm and the second technique uses an algorithm chosen amongst a random forest algorithm and a K nearest neighbor algorithm.
- when the detected limit is the first limit, the first parameter is the voltage and the second parameter is the derivative of the amount of charge lost since the initial instant with respect to the voltage, the criterion used during the detection step being that the second parameter is below a threshold.
- when the detected limit is the first limit, the first parameter is the voltage and the second parameter is the amount of charge lost since the initial instant, the detection criterion being that the change of the first parameter for a set amount of charge lost is below a threshold.
- the at least one electrochemical cell is an $LiFePO_4$, $LiMnFePO_4$ or LVPF type electrochemical cell.

The description also proposes a calculator adapted to predict a parameter relating to the remaining life of at least one electrochemical cell of a battery, the at least one electrochemical cell having an open circuit voltage-state of charge characteristic with a planar portion, a planar portion being a portion wherein the change of the open circuit voltage is less than 30 mV for a change of at least 10% of the state of charge, the planar portion extending between a first limit corresponding to a first value of state of charge and a second limit corresponding to a second value of state of charge. The calculator is adapted to obtain voltage and current measurements of at least one electrochemical cell during a discharge comprising one limit of the planar portion and beginning at an initial instant, to detect one limit of the planar portion using a voltage and current dependent criterion, to calculate values at the detected limit of a first parameter and a second parameter, the first parameter being a parameter relating to voltage and the second parameter being a parameter relating to the amount of charge lost since the initial instant and predicting the resistance of the at least one electrochemical cell by applying a first prediction function to first input parameters, the first input parameters comprising the value of the first parameter at the detected limit and the value of the second parameter at the detected limit, the first prediction function being obtained by a first learning technique, so as to obtain a value of predicted resistance. The calculator is also adapted to predict the capacitance of the at least one electrochemical cell by applying a second prediction function to second input parameters, the second input parameters comprising the value of the first parameter at the detected limit and the value of the second parameter at the detected limit, the second prediction function being obtained by a second learning technique, so as to obtain a value of predicted capacitance, and predicting a parameter relating to the remaining life of the at least one electrochemical cell from the predicted resistance value and the predicted capacitance value.

The description also describes a management system for at least one electrochemical cell of a battery, the at least one electrochemical cell having terminals and an open circuit voltage-state of charge characteristic with a planar portion, a planar portion being a portion wherein the change of the open circuit voltage is less than 30 mV for a change of at least 10% of the state of charge, the planar portion extending between a first limit corresponding to a first value of state of charge and a second limit corresponding to a second value of state of charge, the management system comprising a voltage sensor adapted to measure the voltage across said at least one electrochemical cell during a discharge comprising the planar portion, a current sensor across said at least one electrochemical cell during a discharge comprising the planar portion, and a calculator as described hereinabove.

The description also proposes a battery comprising at least one electrochemical cell, the at least one electrochemical cell having terminals and an open circuit voltage-state of charge characteristic with a planar portion, a planar portion being a portion wherein the change of the open circuit voltage is less than 30 mV for a change of at least 10% of the state of charge, the planar portion extending between a first limit corresponding to a first value of state of charge and a second limit corresponding to a second value of state of charge, and a management system as described hereinabove.

BRIEF DESCRIPTION OF THE DRAWINGS

The features and advantages of the invention will appear upon reading the following description, given only as an example, but not limited to, and making reference to the enclosed drawings, wherein.

DETAILED DESCRIPTION

Figure 1:
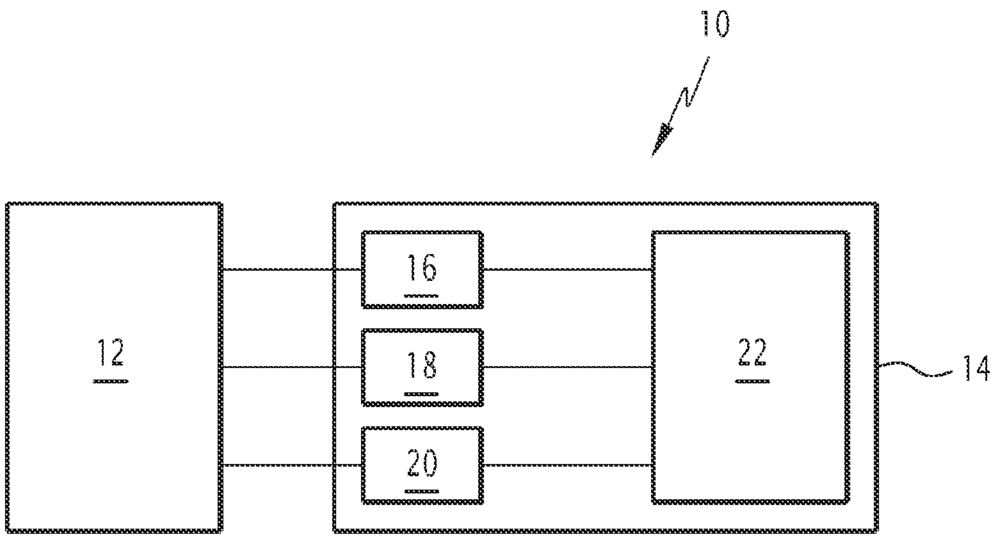
FIG. 1 is a schematic representation of an example of battery including an electrochemical cell.

A battery 10 is shown in FIG. 1.

In a manner known per se, a battery is generally an arrangement of a plurality of electrochemical cells, but to simplify the discussion, a case with a single electrochemical cell is described hereinafter, knowing that the transposition to other arrangements is immediate.

The battery 10 includes an electrochemical cell 12 and a management system 14 for the electrochemical cell 12.

As explained hereinabove, an electrochemical cell 12 is a device for producing electricity wherein chemical energy is converted into electrical energy.

Therefore, the electrochemical cell 12 delivers a current and a voltage between two terminals.

Figure 2:
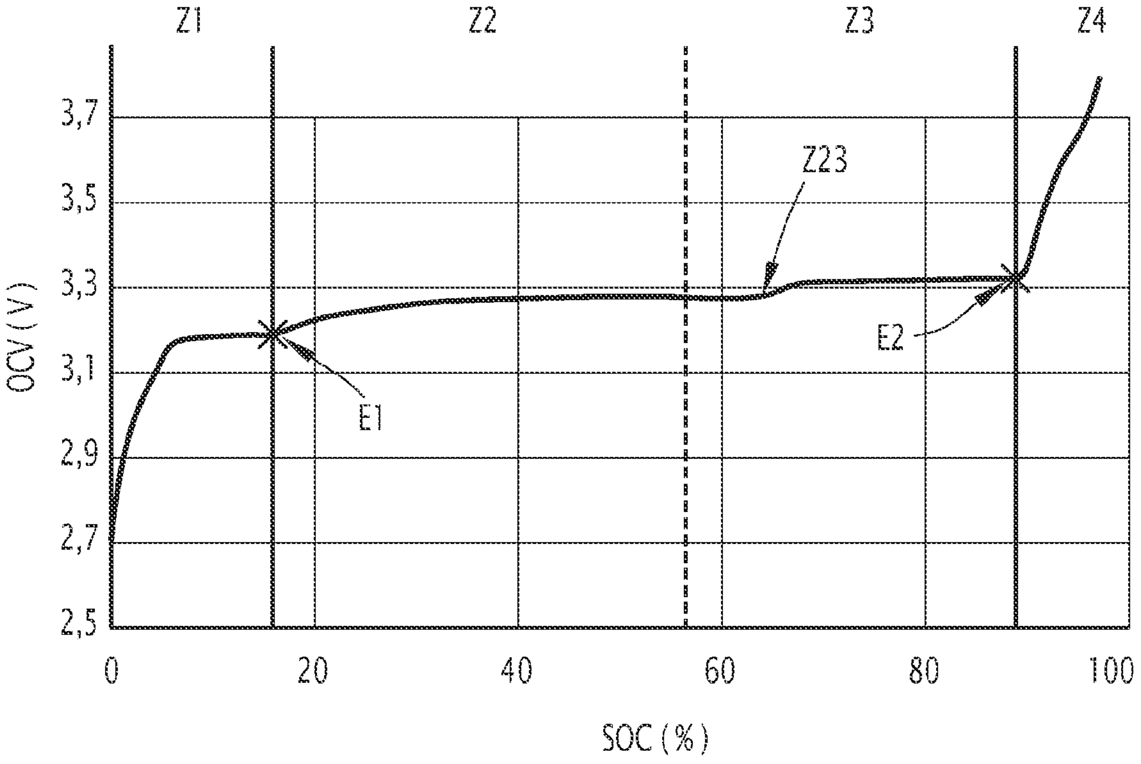
FIG. 2 is a graph illustrating an example of the open circuit voltage-state of charge characteristic of the electrochemical cell.

The electrochemical cell 12 has an open circuit voltage-state of charge characteristic as shown in FIG. 2.

The state of charge is often referred to by the abbreviation SOC thereof. The open circuit voltage is often referred to by the abbreviation OCV thereof. The open circuit voltage-state of charge characteristic will also be hereinafter referred to as the OCV-SOC characteristic.

In FIG. 2, the state of charge (SOC) is expressed as a percentage of a maximum state of charge.

The OCV-SOC characteristic has four zones, a first zone Z1, a second zone Z2, a third zone Z3 and a fourth zone Z4.

The first zone Z1 corresponds to the beginning of charging and the fourth zone Z4 corresponds to the end of charging.

For the two intermediate zones, insofar as the second zone Z2 and the third zone Z3 correspond to a planar portion, the term planar portion Z23 will be used hereinafter.

The planar portion Z23 is a portion wherein the change of the open circuit voltage OCV is less than 30 mV (millivolt) for a change of at least 10% of the state of charge SOC.

The plane portion extends between two limits E1 corresponding to a first value of state of charge SOC and E2 corresponding to a second value of state of charge SOC.

Such a type of OCV-SOC characteristic is found in particular when the electrochemical cell 12 is a $LiFePO_4$, $LiMnFePO_4$, or LVPF electrochemical cell.

A $LiFePO_4$ or $LiMnFePO_4$ electrochemical cell refers to an electrochemical cell the positive electrode (cathode) of which comprises one or a plurality of electrochemically active materials, at least one of which is based on a lithium phosphate of at least one transition metal, with formula $Li_xFe_{1-y}M_yPO_4$, wherein M is selected from the group consisting of B, Mg, Al, Si, Ca, Tl, V, Cr, Mn, Co, Ni, Cu, Zn, Y, Zr, Nb and Mo; $0.8 \leq x \leq 1.2$; and $0 \leq y \leq 0.6$.

LVPF electrochemical cell refers to an electrochemical cell the positive electrode (cathode) of which comprises one or a plurality of electrochemically active materials, at least one of which is based on a compound such as $LiVPO_4F$.

The management system 14 is a system adapted to manage the electrochemical cell 12.

The management system 14 includes a voltage sensor 16, a current sensor 18, a temperature sensor 20 and a calculator 22.

The voltage sensor 16 is suitable for measuring the voltage across the terminals of the electrochemical cell 12.

The current sensor 18 is suitable for measuring the current across the electrochemical cell 12.

The temperature sensor 20 is configured for measuring the temperature of the electrochemical cell 12.

The calculator 22 is adapted to implement a method for predicting a parameter relating to the remaining life.

The calculator 22 is an electronic circuit designed for handling and/or transforming data represented as electronic or physical quantities in registers of the calculator and/or memories in other similar data corresponding to physical data in the register memories or other types of displays, transmission devices or storage devices.

As specific examples, the calculator 22 comprises a single-core or multi-core processor (such as a central processing unit (CPU), a graphics processing unit (GPU), a microcontroller and a digital signal processor (DSP), a programmable logic circuit (such as an application specific integrated circuit (ASIC), an array of field programmable gates (FPGAs), a programmable logic device (PLD) and programmable logic arrays (PLAs), a state machine, a logic gate, and discrete hardware components.

An example of implementation of the method for predicting a parameter relating to the remaining life is now described with reference to the flow chart shown in FIG. 3.

The prediction method includes a step of obtaining E50, a step of detection E52, a step of calculation E54, a first step of prediction E56, a second step of prediction E58 and a step of prediction E60.

During the step of obtaining E50, the calculator 22 obtains measurements of the voltage V and of the current I of the electrochemical cell 12 during a discharge comprising one limit of the planar portion Z23.

Figure 3:
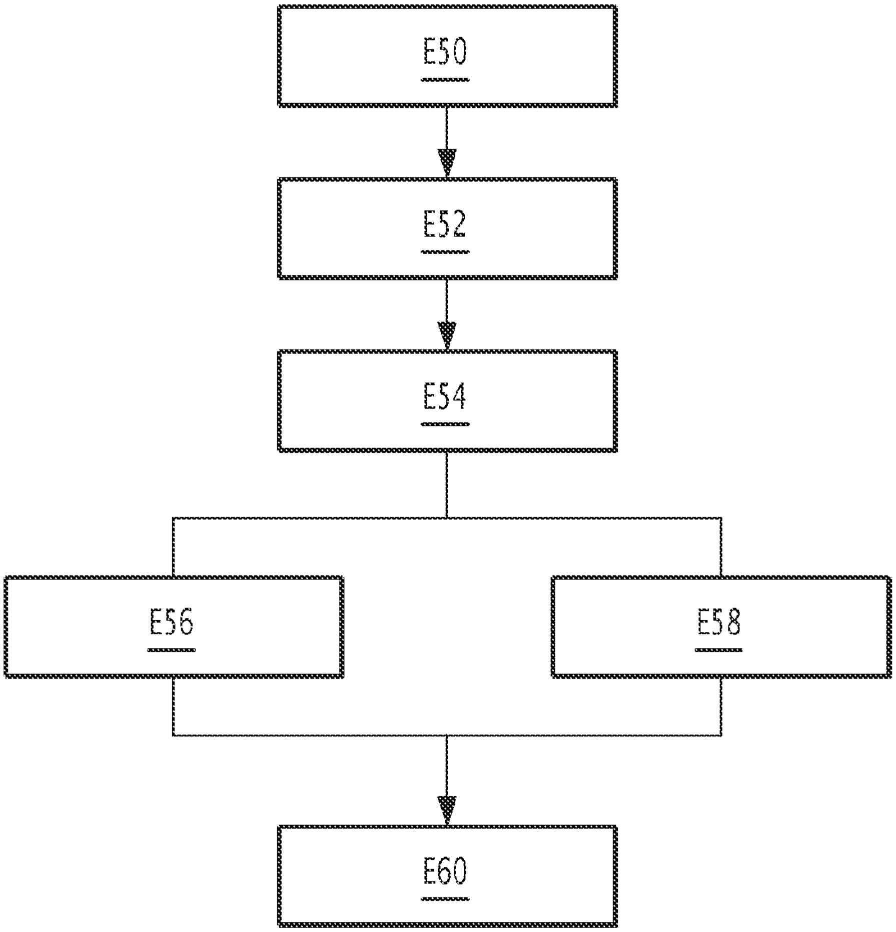
FIG. 3 is a flowchart of an example of implementation of a method for predicting a parameter relating to a remaining life.

In the example shown in FIG. 3, the limit is the second limit E2.

The discharge begins at an initial instant T0.

The charge at the initial instant T0 is maximum so that the discharge begins at the limit of the fourth zone Z4.

In a variant, the charge at the initial instant T0 is lower than the maximum charge but sufficient for the discharge to always begin in the fourth zone Z4.

During the step of detection E52, the calculator 22 detects the second limit E2 of the planar portion Z23.

For this purpose, the calculator 22 determines that a criterion dependent on the voltage and of the current of the electrochemical cell 12 is fulfilled.

In the present case, the criterion is a condition to be fulfilled by the value of the voltage.

In the present case, the value of the voltage is compared with a constant step threshold of the amount of charge lost since the initial instant T0.

It is thereby assumed that the calculator 22 continuously calculates the amount of charge lost since the initial instant T0 (expressed in Ampere-hour).

The amount of charge lost since the initial instant T0 is also obtained as the sum of the current values at a plurality of measurement times each multiplied by the time elapsed between the measurement time and the preceding measurement time.

When the voltage value is lower than the threshold, the calculator 22 detects the limit of the fourth zone, i.e. the second limit E2 of the planar portion Z23.

During the calculation step E54, the calculator 22 calculates the values at the second limit E2 of a first parameter P1 and of a second parameter P2.

The first parameter P1 is a parameter relating to the voltage.

In the present case, the first parameter P1 is the value of the voltage of the electrochemical cell 12.

The value of the first parameter P1 at the second limit E2 is denoted by $$V_{min}^{Z4}$$

The second parameter P2 is a parameter relating to the amount of charge lost since the initial instant T0.

In the present case, the second parameter P2 is the amount of charge lost since the initial instant T0.

The value of the second parameter P2 at the second limit E2 is denoted by $$Q_{dch}^{Z4}.$$

The values $$V_{min}^{Z4} \text{ and } Q_{dch}^{Z4}$$

of the two parameters P1 and P2 thus calculated by the calculator 22 are used in the following steps.

During the first prediction step E56, the calculator 22 predicts the resistance of the electrochemical cell 12.

More precisely, the calculator 22 predicts the value of the resistance of the electrochemical cell 12 at the second limit E2.

For this purpose, the calculator 22 applies a first prediction function F1 to first input parameters PE1 so as to obtain at the output, a value of predicted resistance $$R_p^{E2}$$

corresponding to the value of the resistance of the electrochemical cell 12 at the second limit E2.

The first input parameters PE1 comprise the value $$V_{min}^{Z4}$$

of the first parameter P1 and the value $$Q_{dch}^{Z4}$$

of the second parameter P2.

The first function F1 is obtained by a machine learning technique, hereinafter called the first technique T1.

According to the example described, the first technique T1 uses a random forest algorithm.

The random forest algorithm is more often referred to as the random forest.

The first technique T1 is thus a technique for learning the free parameters of the random forest algorithm from a data set obtained by real experiments in the laboratory, typically for more than 100 different electrochemical cells 12.

During such experiments, electrochemical cells 12 undergo successive cycles and the electrical values of the electrochemical cells 12 are read for forming the data set.

The data set is then separated into a training set and a test set, e.g. in a proportion of 80%-20%.

The training set is used so that the random forest algorithm learns the different free parameters thereof by successive iterations until satisfying a desired performance criterion. Thereby, a model is obtained.

The test set is then used for evaluating the performance of the resulting model.

The model obtained is the first prediction function F1.

The learning is carried out beforehand so that only the first prediction function F1 is stored by the calculator 22.

Thereby, the application of the first prediction function F1 to the value $$V_{min}^{Z4}$$

of the first parameter P1 and to the value $$Q_{dch}^{Z4}$$

of the second parameter P2 is used for obtaining the VALUE OF THE PREDICTED RESISTANCE $$R_p^{E2}.$$

During the second prediction step E58, the calculator 22 predicts the capacitance of the electrochemical cell 12.

More precisely, the calculator 22 predicts the value of the capacitance of the electrochemical cell 12 at the second limit E2.

For this purpose, the calculator 22 applies a second prediction function F2 to second input parameters PE2 so as to obtain at the output, a value of predicted capacitance $$C_p^{E2}$$

corresponding to the value of the capacitance of the electrochemical cell 12 at the second limit E2.

The second input parameters PE2 comprise the value $$V_{min}^{Z4}$$

of the first parameter P1 and the value $$Q_{dch}^{Z4}$$

of the second parameter P2.

The second function F2 is obtained by a machine learning technique, hereinafter called second technique T2.

According to the example described, the second technique T2 also uses a random forest algorithm.

Thereby, the second technique T2 is a technique for learning the free parameters of the random forest algorithm from a data set obtained by real laboratory experiments which can be the same as for the first technique T1. Only the content of the data changes since the data to be predicted are different.

The data set is then separated into a training set and a test set, e.g. in a proportion of 80%-20%.

The training set is used so that the random forest algorithm learns the different free parameters thereof by successive iterations until satisfying a desired performance criterion. Thereby, a model is obtained. It should be noted that the free parameters of the model obtained with the second technique T2 are not the same as the free parameters obtained with the first technique T1.

The test set is then used for evaluating the performance of the model obtained with the second technique T2.

The model obtained with the second technique T2 is the second prediction function F2.

The programming is carried out beforehand so that only the second prediction function F2 is stored by the calculator 22.

Thereby, application of the second prediction function F2 on the value $$V_{min}^{Z4}$$

of the first parameter P1 and the value $$Q_{dch}^{Z4}$$

of the second parameter P2 is used for obtaining the value of the predicted capacitance $$C_p^{E2}.$$

According to the example shown in FIG. 3, the first prediction step E56 and the second prediction step E58 are implemented simultaneously.

Indeed, the two prediction functions F1 and F2 have input parameters PE1 and PE2 which are available at the same time.

During the prediction step E60, the calculator 22 predicts a parameter relating to the remaining life of the electrochemical cell 12 using the value of the predicted capacitance $$C_p^{E2}$$

and the value of the predicted resistance $$R_p^{E2}.$$

In the example shown in FIG. 3, the parameter relating to the remaining life of the electrochemical cell 12 is the remaining life of the electrochemical cell 12.

Furthermore, in the example described, the calculator 22 predicts the value of the remaining life of the electrochemical cell 12.

For this purpose, the calculator 22 applies a third prediction function F3 to third input parameters PE3 so as to obtain at the output, the value of the remaining life of the electrochemical cell 12.

The third input parameters PE3 comprise the value of the predicted capacitance $$C_p^{E2},$$

the value of the predicted resistance $$R_p^{E2}$$

and the time of use of the electrochemical cell 12. For example, the time of use of the electrochemical cell 12 is the time elapsed since the beginning of use by the end user of the device comprising the electrochemical cell 12.

The third function F3 is obtained by a machine learning technique, hereinafter called third technique T3.

According to the example described, the third technique T3 uses a vector autoregressive algorithm.

Thereby, the third technique T3 is a technique for learning the free parameters of the vector autoregressive algorithm from a data set obtained by real laboratory experiments which can be the same as for the first technique T1. Only the content of the data changes since the data to be predicted are different.

The data set is then separated into a training set and a test set, e.g. in a proportion of 80%-20%.

The training set is used so that the vector autoregressive algorithm learns the different free parameters thereof by successive iterations until satisfying a desired performance criterion. Thereby, a model is obtained.

The test set is then used for evaluating the performance of the model obtained with the third technique T3.

The model obtained with the third technique T3 is the third prediction function F3.

More precisely, it should be understood that the vector autoregressive algorithm herein improperly refers to a set of operations, namely an operation corresponding to the use of a statistical model called vector autoregression (more often denoted by the abbreviation VAR) and at least one subsequent operation.

As the name suggests, the first operation uses a VAR model which is a statistical model used for obtaining relationships between multiple quantities varying with time. The VAR model is a particular type of stochastic process model. Such a model can be seen as a generalization of a single variable autoregressive model allowing multivariate time series to be used.

Thereby, in a VAR model, the current value of a quantity to be predicted depends on the values of all the quantities and on the past values of such quantities.

The operation of using the VAR model is used e.g. for predicting the time which will elapse before a value of predefined capacitance of the electrochemical cell 12 is obtained. The predefined value depends in practice on the application envisaged and in particular on the criticality of the application. For example, a value of 20% is acceptable for some applications, but for other applications it will be a value of 25%.

More generally, the operation of using the VAR is used for predicting the time which will elapse before a resistance and/or capacitance condition (generally corresponding to a degraded operation of the electrochemical cell 12) is verified. Such time corresponds in fact to the life of the electrochemical cell 12 taking into account the actual use of the electrochemical cell 12.

According to a second operation, the remaining life is then calculated as the difference between the predicted time and the time already elapsed, i.e. the time of use of the electrochemical cell 12.

The learning is carried out beforehand so that only the third prediction function F3 is stored by the calculator 22.

Thereby, the application of the third prediction function F3 to the value of the predicted capacitance $$C_p^{E2},$$

the value of the predicted resistance $$R_p^{E2}$$

and the time of use of the electrochemical cell 12 leads to obtaining the remaining life of the electrochemical cell 12.

The remaining life thus determined has the advantage of being precise.

Indeed, predictions which are more than 90% accurate according to the Applicant's evaluations were obtained for all possible experimental configurations.

Furthermore, the prediction method is relatively easy to implement since same does not impose any operation constraint on the user of the electrochemical cell.

Indeed, no charging or discharging sequence which is not found in the usual use by the user of the electrochemical cell, is imposed.

The method is compatible with other algorithms.

Thereby e.g. the first technique T1 can also use a K-nearest neighbors algorithm. Such an algorithm is often referred to by the abbreviation KNN.

In a variant, the first technique T1 can use a support vector regression algorithm. Such an algorithm is often referred to by the abbreviation SVR.

According to another variant, the first technique T1 can use a polynomial regression algorithm.

Each of the algorithms has been tested by the Applicant and gives satisfactory performance.

Similarly, the second technique T2 can use a KNN algorithm.

The Applicant has in fact shown that only the random forest and KNN algorithms led to obtaining a satisfactory performance and in particular not the SVR algorithm or the polynomial regression.

The method is also compatible with other input parameters.

Also, as an example, the first input parameters and the second input parameters consist of the value of the current at the second limit E2, the value of the temperature at the second limit E2, the value $$V_{min}^{Z4}$$

of the first parameter P1 and the value $$Q_{dch}^{Z4}$$

of the second parameter P2.

For this purpose, e.g., during the step of obtaining E50, measurements of the temperature of the electrochemical cell 12 during the discharge and during the calculation step E54 are also obtained, the value of the detected limit current and the value of the detected limit temperature are also calculated.

Similarly, according to one embodiment, the third input parameters PE3 comprise the value of the predicted capacitance $$C_p^{E2},$$

the value of the predicted resistance $$R_p^{E2}$$

and the time of use of the electrochemical cell 12, and also the value $$V_{min}^{Z4}$$

of the first parameter P1 and the value $$Q_{dch}^{Z4}$$

of the second parameter P2.

According to one example, the third input parameters PE3 consist of the time of use of the electrochemical cell 12, the value of the current at the second limit E2, the value of the temperature at the second limit E2, the valued of the predicted capacitance $$C_p^{E2},$$

the value of the predicted resistance $$R_p^{E2},$$

the value $$V_{min}^{Z4}$$

of the first parameter P1 and the value $$Q_{dch}^{Z4}$$

of the second parameter P2.

According to yet another example, the first parameter P1 is the ratio between the voltage and the current instead of the voltage (in order to be able to correct the current).

In certain cases, it can be also advantageous to consider the ratio between the voltage decreased by the open circuit voltage OCV at the second limit and the current instead of the voltage (in order to be able to correct the current and the open circuit voltage OCV). Other embodiments of the method can also be envisaged and will now be described.

According to a first example, the first determination step E56 and the second determination step E58 are implemented sequentially.

Indeed, in such a first example, the second input parameters PE2 further include the value of the predicted resistance $$R_p^{E2}.$$

With such a difference, the Applicant was able to observe improvements, on the order of 10%, in the prediction performance of the value of the predicted capacitance $$C_p^{E2}.$$

Therefore, the prediction method according to the first example can be used for obtaining a better prediction of the life.

According to a second example, the prediction method does not use the second limit E2, but the first limit E1.

Remarks similar to the case described with reference to FIG. 3 also apply in said case.

Only the differences are highlighted hereinafter.

During the step of obtaining E50, at the initial instant T0, the state of charge SOC is located on the planar portion Z23.

Furthermore, the first parameter P1 is the voltage and the second parameter P2 is the derivative of the amount of charge lost since the initial instant with respect to the voltage and the criterion used during the detection step E52 is that the second parameter P2 is below a threshold.

The threshold is a relatively low threshold, so as to correspond to a local maximum.

The value of the derivative is obtained by calculating the ratio between the difference between two amounts of charge lost since the initial instant and the difference between the two corresponding voltage measurements.

The derivative is calculated each time the voltage varies by a predefined amount (step).

During the calculation step E54, the calculator 22 obtains for the second example, the value $$V_{min}^{Z23}$$

of the first parameter P1 and the value $$\frac{dQ_{dch}^{Z23}}{dv}$$

of the second parameter P2.

The experiments of the Applicant also made it possible to obtain a satisfactory prediction performance with the first limit E1 of the planar portion Z23.

Nevertheless, the use of the KNN algorithm for the second technique T2 proved to be less satisfactory.

Therefore, for uses which do not involve using the fourth zone Z4, such a technique will be interesting since the predictions can be made without a particular measurement cycle.

Finally, for each of the embodiments described, it should be noted that it is possible to use the correct determination of the predicted values for capacitance and resistance in combination with a technique for determining the parameter relating to the remaining life such as, e.g., by calculating the ratio between the battery capacitance at a given time and the battery capacitance in the new or initial condition under the same measurement conditions (in particular under the same temperature conditions) and/or the ratio between the resistance of the battery at a given time and the capacitance of the battery in the new or initial state under the same measurement conditions (in particular under the same temperature conditions). Thereby, the latter parameters can be considered as parameters relating to the remaining life.

The invention claimed is:

1. A method for predicting a parameter relating to a remaining life of at least one electrochemical cell of a battery, the at least one electrochemical cell having a resistance, a capacitance and an open circuit voltage-state of charge characteristic with a planar portion, the planar portion being a portion wherein a change of an open circuit voltage is less than 30 millivolts (mV) for a change of at least 10% of a state of charge, the planar portion extending between a first limit corresponding to a first value of the state of charge and a second limit corresponding to a second value of the state of charge, the method being implemented by a calculator, the method comprising:

obtaining voltage and current measurements of the at least one electrochemical cell during a discharge comprising a limit of the planar portion and beginning at an initial instant, detecting the limit of the planar portion using a criterion depending on the voltage and current measurements, calculating a value of a first parameter at the detected limit and a value of a second parameter at the detected limit, the first parameter being a parameter relating to voltage and the second parameter being a parameter relating to an amount of charge lost since the initial instant, predicting the resistance of the at least one electrochemical cell by applying a first prediction function to first input parameters, the first input parameters comprising the value of the first parameter at the detected limit and the value of the second parameter at the detected limit, the first prediction function being obtained by a first learning technique, so as to obtain a value of the predicted resistance, predicting the capacitance of the at least one electrochemical cell by applying a second prediction function to second input parameters, the second input parameters comprising the value of the first parameter at the detected limit and the value of the second parameter at the detected limit, the second prediction function being obtained by a second learning technique, so as to obtain a value of the predicted capacitance, and predicting the parameter relating to the remaining life of the at least one electrochemical cell from the value of the predicted resistance and the value of the predicted capacitance.

2. The method according to claim 1, wherein predicting the parameter relating to the remaining life is implemented by applying a third prediction function to third input parameters, the third input parameters comprising the value of the predicted resistance, the value of the predicted capacitance, the value of the first parameter at the detected limit and the value of the second parameter at the detected limit, the third prediction function being obtained by a third learning technique.

3. The method according to claim 2, wherein the third learning technique uses a vector autoregressive algorithm.

4. The method according to claim 1, wherein, during the obtaining, temperature measurements of the at least one electrochemical cell are also obtained during the discharge and, during the calculation, a value of current at the detected limit and a value of temperature at the detected limit are also calculated, the first input parameters and the second input parameters consisting of the value of the current at the detected limit, the value of the temperature at the detected limit, the value of the first parameter and the value of the second parameter.

5. The method according to claim 1, wherein during the calculating, a value of current and a value of temperature are also calculated, the first input parameters consisting of the value of the current, the value of the temperature, the value of the first parameter and the value of the second parameter, and the second input parameters consisting of the value of the current, the value of the temperature, the value of the first parameter, the value of the second parameter and the value of the predicted resistance.

6. The method according to claim 1, wherein, the first learning technique uses an algorithm chosen amongst a random forest algorithm, a K-nearest neighbors algorithm, a support vector regression algorithm and a polynomial regression algorithm, and the second learning technique uses an algorithm chosen amongst the random forest algorithm and the K-nearest neighbors algorithm.

7. The method according to claim 1, wherein:

when the detected limit is the first limit, the first parameter is the voltage and the second parameter is a derivative of the amount of charge lost since the initial instant with respect to the voltage, the criterion used during the detection being that the second parameter is below a threshold, or when the detected limit is the first limit, the first parameter is the voltage and the second parameter is the amount of charge lost since the initial instant, the detection criterion being that a change of the first parameter with the amount of charge lost is below the threshold.

8. The method according to claim 1, wherein the at least one electrochemical cell is chosen from a list consisting of a lithium iron phosphate ($LiFePO_4$) electrochemical cell, a lithium manganese iron phosphate ($LiMnFePO_4$) electrochemical cell and a lithium vanadium fluorophosphate (LVPF) electrochemical cell.

9. A calculator adapted to predict a parameter relating to a remaining life of at least one electrochemical cell of a battery, the at least one electrochemical cell having an open circuit voltage-state of charge characteristic with a planar portion, the planar portion being a portion wherein a change of an open circuit voltage is less than 30 millivolts (mV) for a change of at least 10% of a state of charge, the planar portion extending between a first limit corresponding to a first value of the state of charge and a second limit corresponding to a second value of the state of charge, the calculator being adapted to:

obtain voltage and current measurements of the at least one electrochemical cell during a discharge comprising a limit of the planar portion and beginning at an initial instant, detect the limit of the planar portion using a criterion depending on the voltage and current measurements, calculate a value of a first parameter at the detected limit and a value of a second parameter at the detected limit, the first parameter being a parameter relating to voltage and the second parameter being a parameter relating to an amount of charge lost since the initial instant, predict a resistance of the at least one electrochemical cell by applying a first prediction function to first input parameters, the first input parameters comprising the value of the first parameter at the detected limit and the value of the second parameter at the detected limit, the first prediction function being obtained by a first learning technique, so as to obtain a value of the predicted resistance, predict a capacitance of the at least one electrochemical cell by applying a second prediction function to second input parameters, the second input parameters comprising the value of the first parameter at the detected limit and the value of the second parameter at the detected limit, the second prediction function being obtained by a second learning technique, so as to obtain a value of the predicted capacitance, and predict the parameter relating to the remaining life of the at least one electrochemical cell from the value of the predicted resistance and the value of the predicted capacitance.

10. A management system for the at least one electrochemical cell of the battery, the at least one electrochemical cell having terminals and the open circuit voltage-state of charge characteristic with the planar portion, the planar portion being the portion wherein the change of the open circuit voltage is less than 30 m V for the change of at least 10% of the state of charge, the planar portion extending between the first limit corresponding to the first value of the state of charge and the second limit corresponding to the second value of the state of charge, the management system comprising:

a voltage sensor adapted to measure the voltage across the at least one electrochemical cell during the discharge including the planar portion, a current sensor adapted to measure current at the terminals of the at least one electrochemical cell during the discharge comprising the planar portion, and the calculator according to claim 9.

11. A battery comprising:

at least one electrochemical cell, the at least one electrochemical cell having the terminals and the open circuit voltage-state of charge characteristic with the planar portion, the planar portion being the portion wherein the change of the open circuit voltage is less than 30 mV for the change of at least 10% of the state of charge, the planar portion extending between the first limit corresponding to the first value of the state of charge and the second limit corresponding to the second value of the state of charge, and a management system for the at least one electrochemical cell of the battery, the management system comprising a voltage sensor adapted to measure the voltage across the at least one electrochemical cell during the discharge including the planar portion, a current sensor adapted to measure current at the terminals of the at least one electrochemical cell during the discharge comprising the planar portion, and a calculator adapted to predict a parameter relating to a remaining life of the at least one electrochemical cell of the battery, the calculator being adapted to:

obtain voltage and current measurements of the at least one electrochemical cell during a discharge comprising a limit of the planar portion and beginning at an initial instant, detect the limit of the planar portion using a criterion depending on the voltage and current measurements, calculate a value of a first parameter at the detected limit and a value of a second parameter at the detected limit, the first parameter being a parameter relating to voltage and the second parameter being a parameter relating to an amount of charge lost since the initial instant, predict a resistance of the at least one electrochemical cell by applying a first prediction function to first input parameters, the first input parameters comprising the value of the first parameter at the detected limit and the value of the second parameter at the detected limit, the first prediction function being obtained by a first learning technique, so as to obtain a value of the predicted resistance, predict a capacitance of the at least one electrochemical cell by applying a second prediction function to second input parameters, the second input parameters comprising the value of the first parameter at the detected limit and the value of the second parameter at the detected limit, the second prediction function being obtained by a second learning technique, so as to obtain a value of the predicted capacitance, and predict the parameter relating to the remaining life of the at least one electrochemical cell from the value of the predicted resistance and the value of the predicted capacitance.

* * * * *